United States Patent [19]
Liang et al.

[11] Patent Number: 5,614,430
[45] Date of Patent: Mar. 25, 1997

[54] ANTI-PUNCHTHROUGH ION IMPLANTATION FOR SUB-HALF MICRON CHANNEL LENGTH MOSFET DEVICES

[75] Inventors: Mong-Song Liang; Jin-Yuan Lee, both of Hsin-Chu, Taiwan

[73] Assignee: Taiwan Semiconductor Manufacturing Company Ltd., Hsinchu, Taiwan

[21] Appl. No.: 613,652

[22] Filed: Mar. 11, 1996

[51] Int. Cl.$^6$ ............................................... H01L 21/762
[52] U.S. Cl. ................... 437/45; 437/44; 437/67
[58] Field of Search ................... 437/28, 29, 30, 437/44, 45, 67, 931

[56] References Cited

U.S. PATENT DOCUMENTS

| | | | |
|---|---|---|---|
| 4,455,740 | 6/1984 | Iwai | 437/45 |
| 4,808,548 | 2/1989 | Thomas et al. | 437/67 |
| 5,108,937 | 4/1992 | Tsai et al. | 437/40 |
| 5,270,234 | 12/1993 | Huang et al. | 437/44 |
| 5,472,897 | 12/1995 | Hsu et al. | 437/45 |
| 5,489,543 | 2/1996 | Hong | 437/44 |

OTHER PUBLICATIONS

S. Wolf, "Silicon Processing For The VLSI Era–vol. 1", Lattice Press, Sunset Beach, CA, 1995, pp. 232–239.

*Primary Examiner*—Chandra Chaudhari
*Attorney, Agent, or Firm*—George O. Saile

[57] ABSTRACT

A method for forming a MOSFET device, with reduced exposure to source and drain leakage currents, that can arise due to a junction depletion punchthrough phenomena, has been developed. An anti-punchthrough, ion implantation, is performed in a confined area below the channel region. The ability to confine the area used for the anti-punchthrough region, results in protection against leakage, however with only a minimum of parasitic capacitance increase. The confined, anti-punchthrough region is obtained via ion implantation procedures into a channel region, using polysilicon sidewalls for purposes of placing the implanted region only into desired regions below the channel region.

28 Claims, 7 Drawing Sheets

ANTI-PUNCHTHROUGH ION IMPLANTATION FOR SUB-HALF MICRON CHANNEL LENGTH MOSFET DEVICES

BACKGROUND OF THE INVENTION

1. FIELD OF THE INVENTION

The present invention relates to a process in which metal oxide semiconductor field effect transistors, (MOSFET), are fabricated, with specific process steps included to decrease the risk of junction punchthrough.

2. DESCRIPTION OF PRIOR ART

Very large scale integration, (VLSI), has allowed the semiconductor chip industry to increase circuit density while still maintaining, or reducing cost. This has been accomplished by ability of the semiconductor industry to fabricate silicon devices with sub-micron features, or micro-miniaturazation. The attainment of sub-micron features has been achieved mainly by advances in specific semiconductor fabrication disciplines, such as photolithography and reactive ion etching, (RIE). The use of more sophisticated exposure cameras, as well as the development of more sensitive photoresist materials, have allowed sub-micron images in photoresist to be routinely obtained. Similar advances in dry etching tools and processes have resulted in the successful transfer of these sub-micron images in photoresist, to underlying materials, used for the fabrication of advanced MOSFET devices.

However with the trend to smaller devices, specific yield detractors, and reliability risks, become more prevalent. For example as the gate insulator of a MOSFET device becomes thinner, in an attempt to improve device performance, the possibility of yield loss, due to insulator breakdown becomes greater. In addition as the channel length of the MOSFET becomes shorter, again to improve performance, the reliability risk of hot electron injection increase.

Narrower channel lengths also present yield problems in terms of junction punchthrough. As the channel length of a MOSFET device shortens, the space between depletion regions, created from the source region and the substrate, and from the drain region and substrate, decrease. This close proximity, or touching of depletion regions, can result in punchthrough leakages, or yield detractors. Several solutions for the punchthrough leakage phenomena have previously been described. For example Tsai, et al, in U.S. Pat. No. 5,108,937, describe a structure in which the polysilicon gate and gate insulator are recessed to a level equal to the bottom of the source and drain regions, to block the depletion regions from touching. This solution, although supplying protection from the punchthrough mechanism, results in additional complexity and costs. Other solutions offer increasing the doping level of the substrate, in the channel region and also in the source and drain regions. The increased doping levels of the substrate, reduce the severity of the depletion region. The increase of the substrate doping levels, specifically in the MOSFET channel region, is accomplished via an anti-punchthrough, ion implantation procedure. However the reduction in the yield degrading punchthrough leakages, is achieved at the expense of performance degrading increases in capacitances, due to the higher concentration of substrate doping in the source and drain channel region.

This invention will also describe an anti-punchthrough, ion implant solution, for narrow, sub-half micron, channel lengths. However this invention will describe a process that restricts the amount of substrate, experiencing the punchthrough implant, however still allowing reductions in depletion region formation, but not resulting in the level of capacitance increase observed with prior art, anti-punchthrough, ion implantation procedures.

SUMMARY OF THE INVENTION

It is an object of this invention to provide a process for manufacturing a sub-half micron channel length, MOSFET device, that will improve circuit performance, via reductions of junction capacitances.

It is another object of this invention to open a hole in an insulator, overlying the substrate, to be used for the gate region of the MOSFET device.

It is still another object of this invention to deposit a first polysilicon layer creating, a polysilicon sidewall on the sides of the opened hole.

It is yet another object of this invention to perform an ion implantation procedure, in regions of the opened hole not covered by polysilicon sidewall, used to reduce the risk of depletion region leakages.

In accordance with the present invention a method is described for fabricating a MOSFET device in which depletion region, junction leakages, are reduced. Using conventional photolithographic and RIE procedures a shallow trench is formed in the substrate. The shallow trench is filled with a chemically vapor deposited insulator, followed by removal of the insulator from all areas except from the trench, via chemical mechanical polishing processing. Another insulator deposition is performed, followed by conventional photolithographic and RIE procedures, used to create an opening in the insulator, to the underlying substrate, to be used for a subsequent gate region. An ion implantation is then performed into the exposed substrate, for purposes of adjusting the threshold voltage of the ensuing MOSFET device. After the growth of a thin gate insulator, a first layer of polysilicon is deposited, followed by ion implantation procedure, performed at an energy needed to alter the doping level of the underlying substrate, in the gate region. The gate region, receiving the ion implantation procedure, has been narrowed by the creation of a first polysilicon sidewall. This high energy implant procedure is used for purposes of reducing subsequent depletion region, junction leakages. A second layer of polysilicon is then deposited using either insitu doping techniques, or deposited intrinsically and doped via ion implantation procedures. Chemical mechanical polishing is employed to remove the second and first polysilicon layers from all areas except from the gate region. After removal of the insulator, used to define the gate region, via RIE processes, a lightly doped source and drain region is created via ion implantation processing. An insulator sidewall spacer is next formed via chemical vapor deposition of an insulator, followed by a selective, anisotropic, RIE procedure. A heavily doped source and drain region is created via another ion implantation procedure, followed by deposition of an insulator, contact hole opening to a MOSFET active device region, deposition and patterning of a contact metallization.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
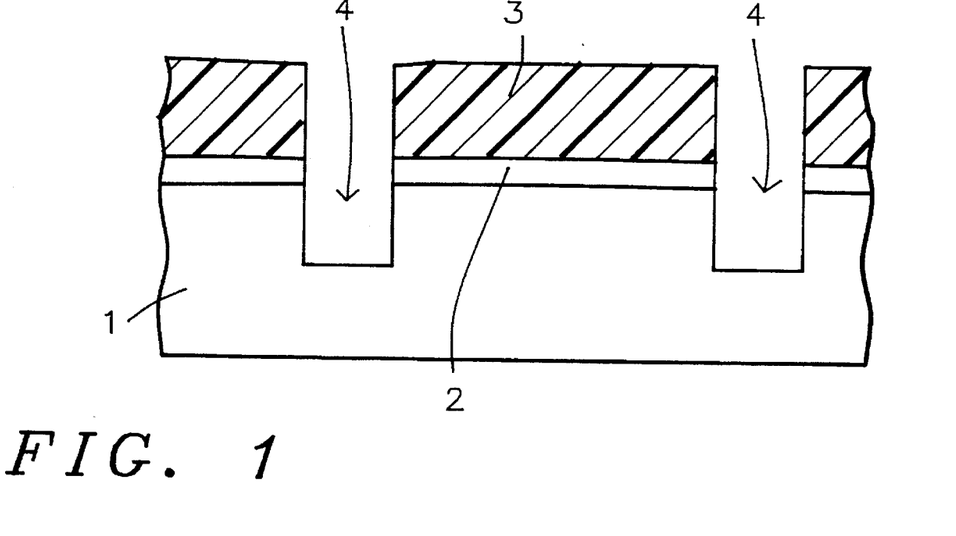
FIGS. 1–9, which schematically show the stages of fabrication used to create a MOSFET device with an effective, narrow region, used to reduce junction leakages, attributed to punchthrough phenomena.
Figure 2:
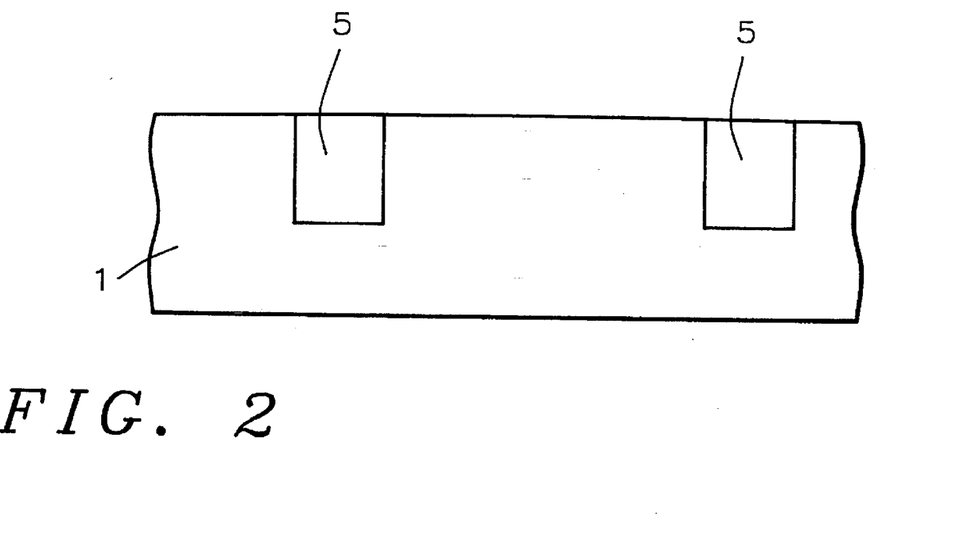

The method of creating a MOSFET device, with a sub-half micron channel length, using a ion implantation procedure to create a deep, narrow region, needed to reduce the risk of punchthrough leakages, will now be covered in detail. Referring to FIG. 1, a substrate, 1, composed of P type, single crystalline silicon, with a <100> orientation, is used. A silicon dioxide layer, 2, is grown using thermal oxidation processing, to a thickness between about 500 to 2000 Angstroms. Standard photolithographic processing is employed to create photoresist shape, 3. Anisotropic, reactive ion etching, is used to create shallow trench, 4, shown schematically in FIG. 1. The RIE procedure is performed using $CHF_3$ as an etchant for silicon dioxide layer, 2, while either $Cl_2$, $SF_6$ or HBr, is used to etch substrate, 1. Shallow trench, 4, is etched to a depth between about 0.3 to 1.0 uM, and has a width between about 0.1 to 200 uM. After photoresist removal, using plasma oxygen ashing, followed by careful wet cleans, a layer of silicon oxide, 5, is deposited, using either low pressure chemical vapor deposition, (LPCVD), or plasma enhanced chemical vapor deposition, (PECVD), processing, at a temperature between about 400° to 800° C., to a thickness between about 5000 to 20000 Angstroms, using tetraethylorthosilicate, (TEOS), as a source. Chemical mechanical polishing procedures, are used to remove silicon oxide layer, 5, from all regions except from shallow trench, 4. This is shown in FIG. 2.

Figure 3:
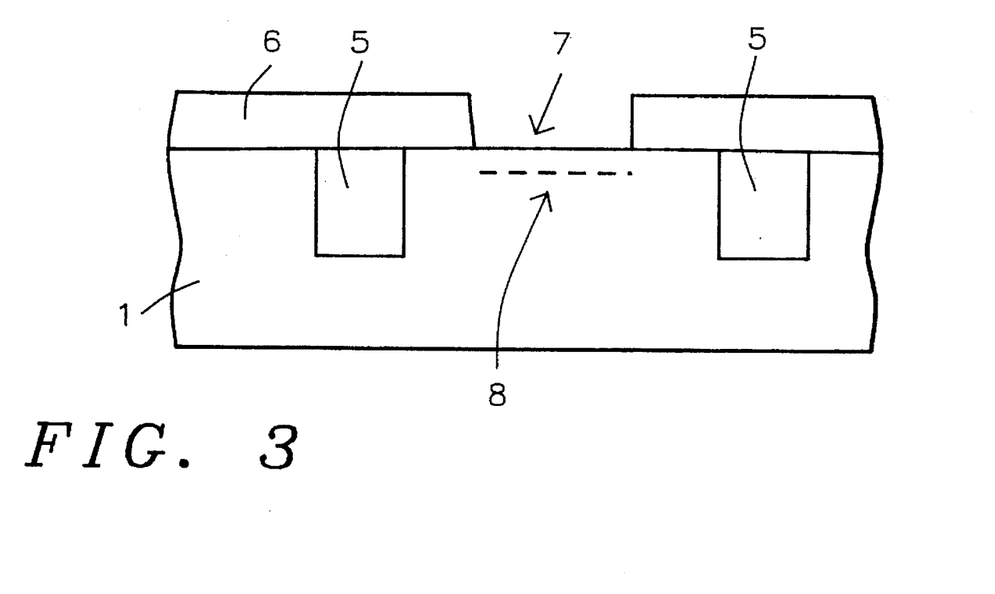
Figure 4:
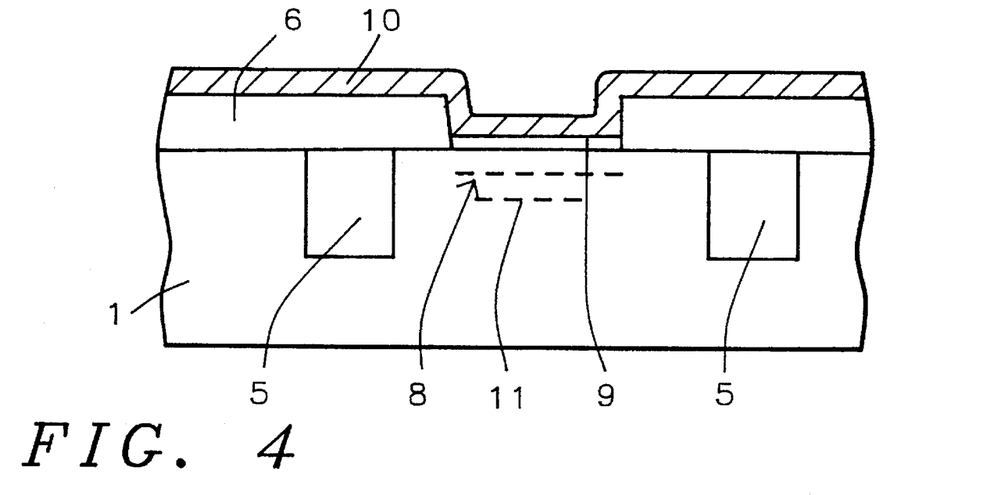

Another layer of silicon oxide, 6, is deposited, again via use of either LPCVD or PECVD processing, at a temperature between about 400° to 800° C., to a thickness between about 3000 to 5000 Angstroms, using TEOS as a source. Conventional photolithographic and RIE procedures, using $CHF_3$ as an etchant, are used to open region, 7, shown in FIG. 3, and to be used for the subsequent gate region. The width of the opened region, 7, is between about 0.1 to 0.4 uM. After photoresist removal, via plasma oxygen ashing, followed by careful wet cleans, an ion implantation procedure, using either $BF_2$ or $B^{11}$, at an energy between about 10 to 30 Kev., at a dose between about 1E12 to 5E12 atoms/$cm^2$, is used to create a threshold voltage adjust region, 8, shown schematically in FIG. 3. After careful wet cleans, a silicon dioxide, gate insulator, 9, is thermally grown, in an oxygen-steam ambient, at a temperature between about 700° to 1000° C., to a thickness between about 30 to 300 Angstroms. Next the deposition of polysilicon layer, 10, is performed using LPCVD processing, at a temperature between about 500° to 650° C., to a thickness between about 300 to 1000 Angstroms. This is shown in FIG. 4. The width of opened region, 7, has now been decreased by the deposition of polysilicon layer, 10, depositing on the sidewall of opened region, 7. This reduced opening now accepts an ion implantation of boron, at an energy between about 60 to 150 Kev., at a dose between about 1E12 to 3E13 atoms/$cm^2$, to form an anti-punchthrough region, 11, shown in FIG. 4. Region, 11, has a higher P type concentration, then that of substrate, 1, and therefore depletion regions formed from a junction of a subsequent source or drain, and region, 7, will be smaller then depletion regions that would have been formed from a junction of the same subsequent source or drain regions, but with the higher resistivity substrate, 1. In addition the ability to limit the anti-punchthrough region, 11, to an area smaller then the opened region, 7, will result in less capacitance, then if anti-punchthrough region, 11, was as wide as opened region, 7. Again this was made possible by reducing the width of opened region, 7, by polysilicon layer, 10, depositing on the sidewalls of opened region, 7.

Figure 5:
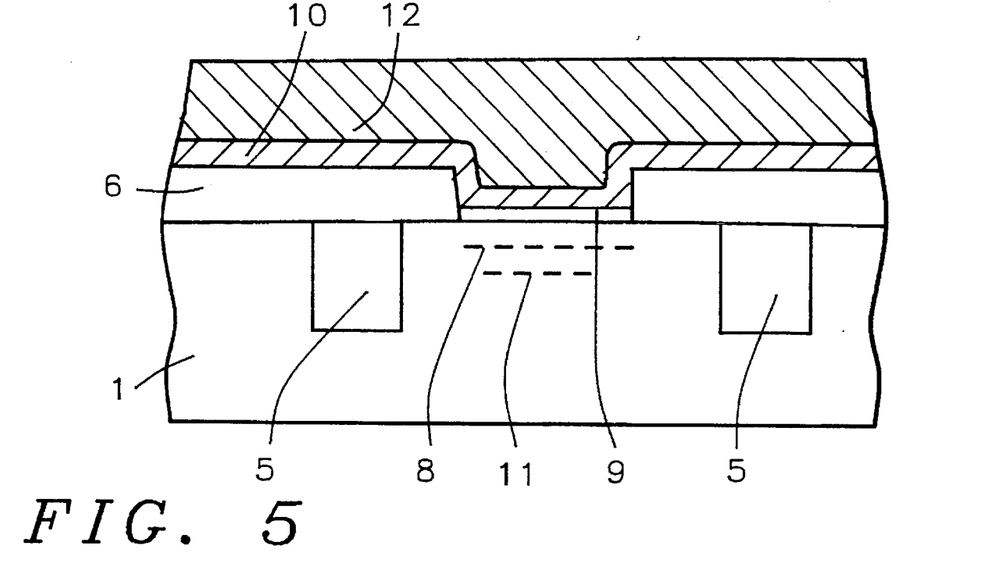
Figure 6:
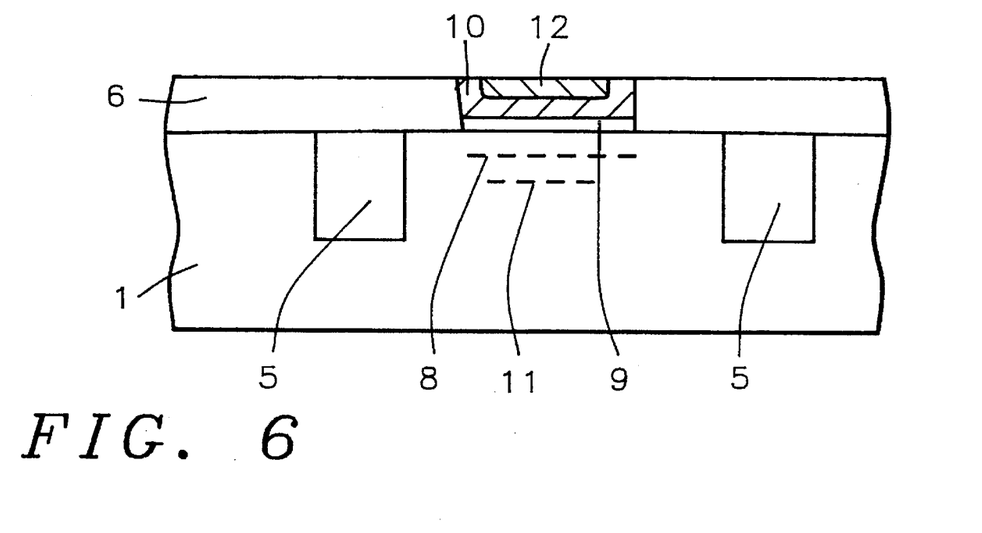
Figure 7:
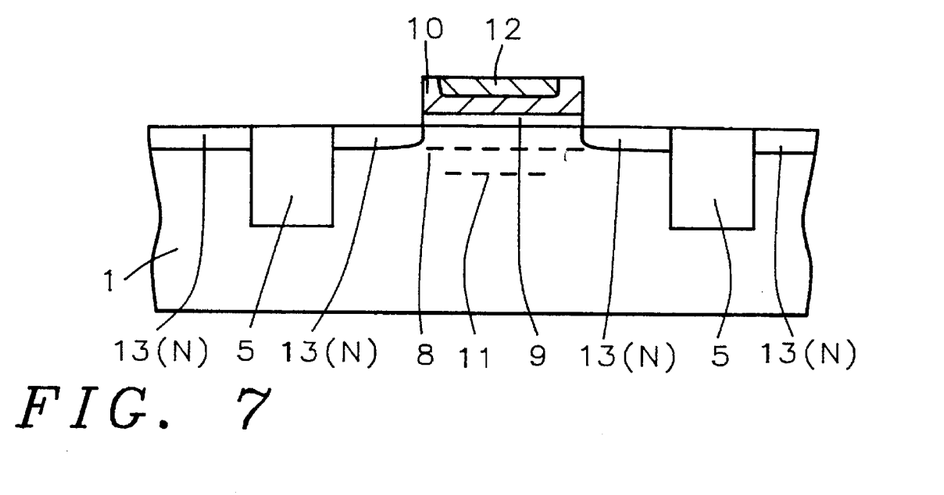

A second layer of polysilicon, 12, shown in FIG. 5, is deposited, again using LPCVD processing, at a temperature between about 500° to 650° C., to a thickness between about 3000 to 5000 Angstroms. The polysilicon can be grown using insitu doping procedures, via incorporation of arsine or phosphine, to the silane ambient. Polysilicon layer, 12, can also be deposited intrinsically, and doped via ion implantation of arsenic or phosphorous, at an energy between about 30 to 75 Kev., at a dose between about 5E14 to 1E16 atoms/$cm^2$. Subsequent heat cycles will distribute the dopant from polysilicon layer, 12, into underlying polysilicon layer, 10. FIG. 6, shows the result of a chemical mechanical polishing procedure, or a RIE procedure, using $Cl_2$ as an etchant, selectively removing polysilicon from the top surface of insulator layer, 6. Insulator layer, 6, is next removed, via RIE processing, using $CHF_3$ as an etchant. The RIE procedure is performed to a point where substrate, 1, is exposed, minimizing any over etching, and any thinning of silicon oxide layer, 5, in shallow trench, 4. A second iteration of this invention will later show the removal of insulator layer, 6, but end pointing on an underlying polysilicon buffer layer. Next an N type, lightly doped source and drain region, 13, is created via ion implantation of phosphorous or arsenic, at an energy between about 10 to 30 Kev., at a dose between about 1E13 to 1E14 atoms/$cm^2$. This is shown in FIG. 7.

Figure 8:
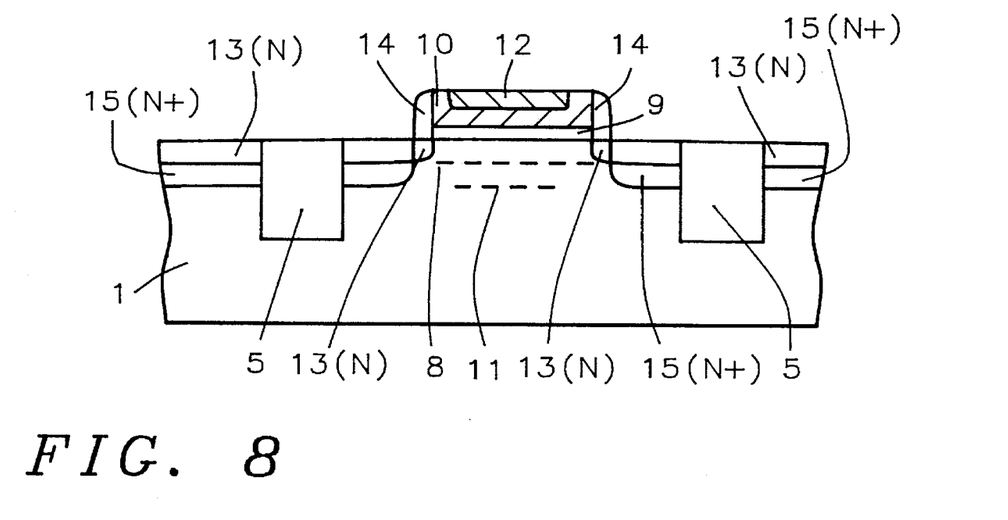

FIG. 8, shows the creation of insulator sidewall spacer, 14, created via deposition of a silicon oxide layer, using either LPCVD or PECVD processing, at a temperature between about 400° to 800° C., to a thickness between about 1000 to 4000 Angstroms, followed by a selective, anisotropic, RIE procedure, using $CHF_3$ as an etchant. Again for this iteration, the RIE endpoint is the appearance of lightly doped source and drain region, 13, attempting to minimize the etching of silicon oxide layer, 5, in shallow trench, 4. A heavily doped, N type, source and drain region, 15, is then formed via ion implantation of arsenic, at an energy between about 20 to 100 Kev., at a dose between about 1E15 to 5E15 atoms/$cm^2$. FIG. 8, schematically indicates the strategic placement of anti-punchthrough region, 11, between the heavily doped source and drain regions, however effectively spaced away from the heavily doped, source and drain region, 15, in an effort to minimize capacitance.

Figure 9:
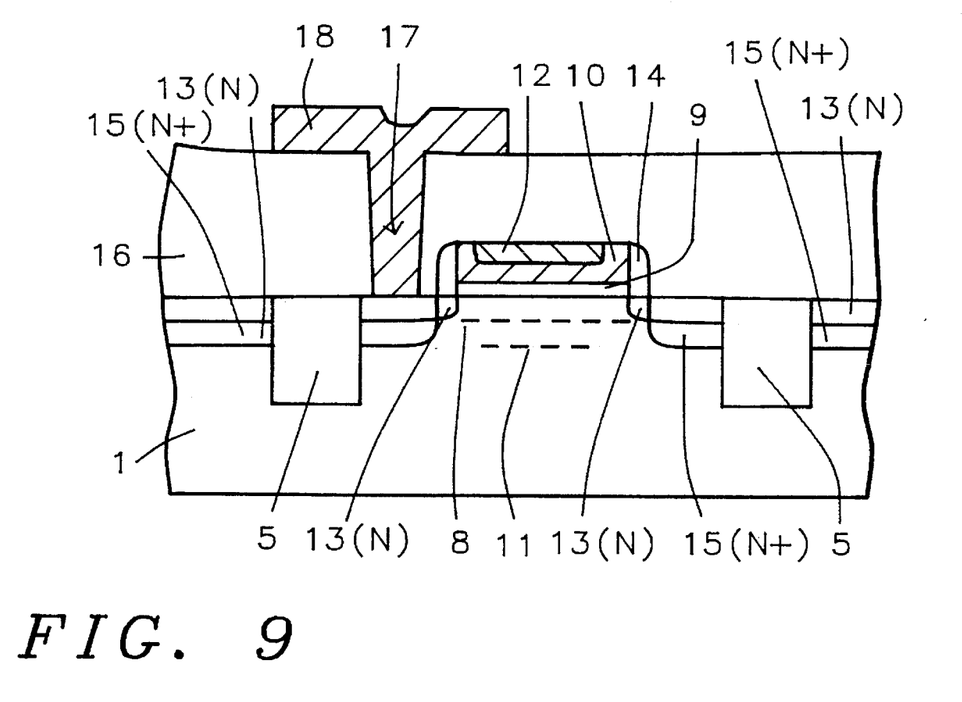
Figure 10:
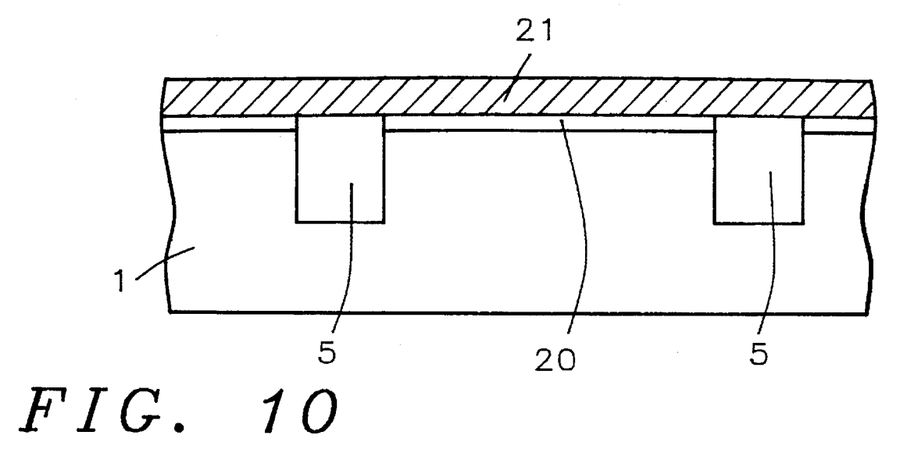
FIGS. 10–13, which schematically show a second iteration of a process used to create the MOSFET device, with an effective, narrow region, used to reduce junction leakages.

An interlevel dielectric layer of silicon oxide, 16, is next deposited using LPCVD or PECVD processing, at a temperature between about 400° to 800° C., to a thickness between about 5000 to 15000 Angstroms. Dielectric layer 16, is planarized using chemical mechanical polishing procedures. Conventional photolithographic and RIE procedures, using $CHF_3$ as an etchant, are used to create contact hole, 17, shown schematically in FIG. 9. After photoresist removal, via plasma oxygen ashing, followed by careful wet cleans, a layer of titanium, and a layer of titanium nitride, between about 500 to 1500 Angstroms, are deposited via r.f.sputttering procedures, and followed by a layer of aluminum, containing between about 1 to 3% copper, and between about 0 to 2% silicon, again deposited using r.f. sputtering, to a thickness between about 3000 to 8000 Angstroms. Conventional photolithographic and RIE procedures, using a $Cl_2$ etchant, are used to create metallization structure, 18, shown in FIG. 9. Plasma oxygen ashing, followed by careful wet cleans, are again used to remove photoresist.

Figure 11:
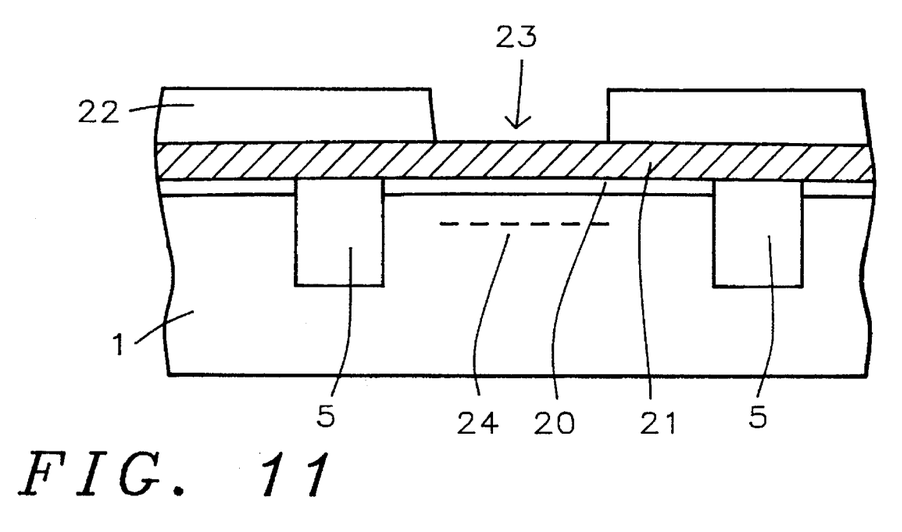
Figure 12:
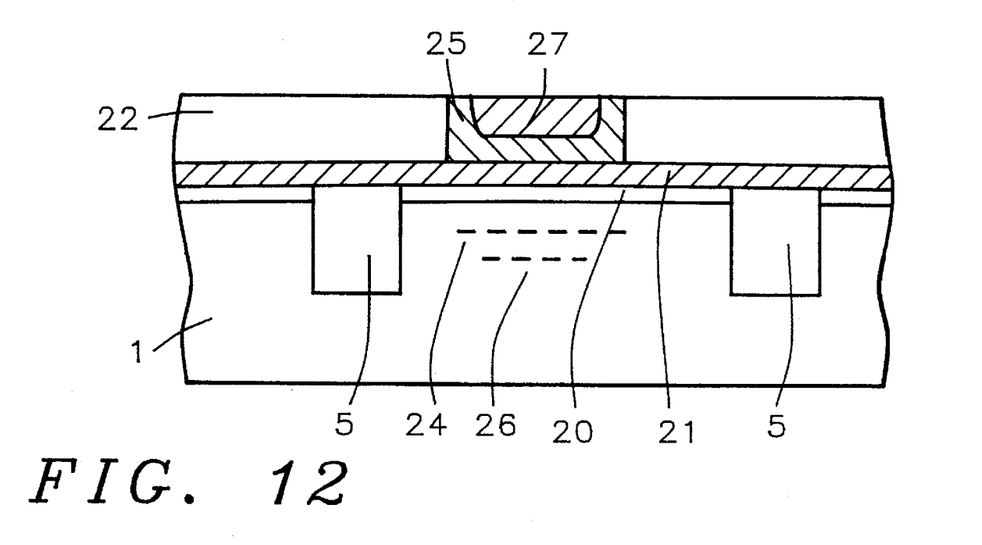
Figure 13:
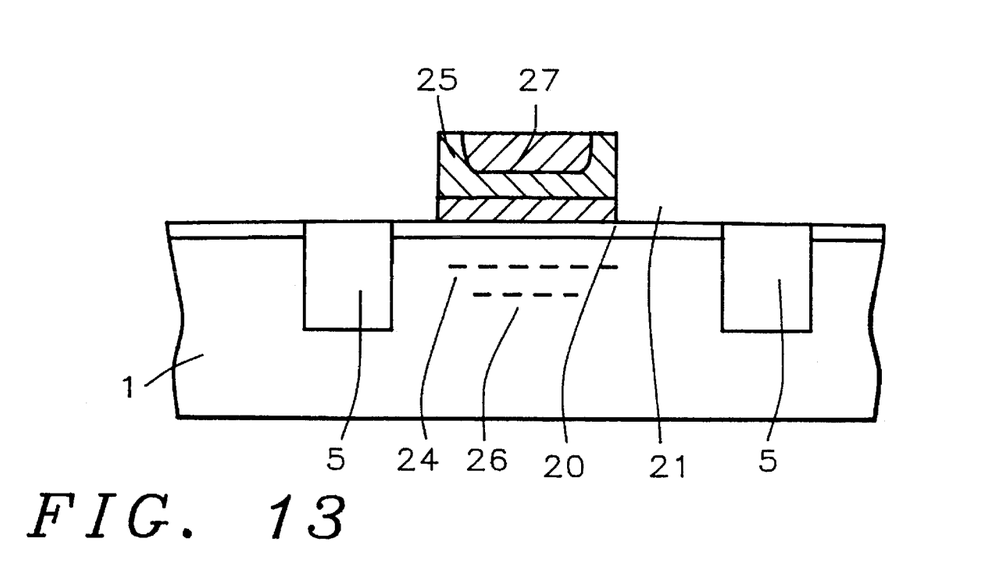

A second iteration, allowing for a more selective removal of silicon oxide layer, 6, without exposing silicon oxide layer, 5, in shallow trench, 4, is now described and shown schematically in FIGS. 10–13. Referring to back to the structure previously shown in FIG. 3, and now dscribed in FIG. 10, a gate insulator, silicon dioxide, 20, is again thermally grown, in an oxygen-steam ambient, at a temperature between about 700° to 1000° C., to a thickness between about 30 to 300 Angstroms. A thin layer of polysilicon, 21, is deposited, using LPCVD processing, at a temperature between about 500° to 650° C., to a thickness between about 300 to 600 Angstroms. Silicon oxide layer, 22, is deposited at conditions, and to a thickness, identical to conditions and thickness previously described for silicon oxide layer, 6. Opened region, 23, shown in FIG. 11, is opened to a width, and using RIE conditions identical, to a width and RIE conditions used to create opened region, 7, previously described and shown in FIG. 3. The threshold adjust ion implantation process, previously described and shown as region 8, in FIG. 3, is again used to create threshold adjust region, 24, shown in FIG. 11. A polysilicon layer, 25, is again deposited, via LPCVD processing, and used to narrow opened region, 23, followed by an anti-punchthrough region, 26, to be created via ion implantation of boron at an energy between about 60 to 150 Kev., at a dose between about 1E12 to 3E13 atoms/cm$_2$. The deposition and doping of polysilicon layer, 27, and the chemical mechanical polishing procedures employed to remove unwanted polysilicon, are identical to conditions used in the first iteration, for these layers and processes. This is schematically shown in FIG. 12. The removal of silicon oxide layer, 22, can now be accomplished via RIE procedures, without exposing silicon oxide layer, 5, in shallow trench, 4. Therefore the removal and overetch RIE procedure is performed using CHF$_3$. The removal of thin polysilicon layer, 21, is accomplished via a timed RIE procedure, using Cl$_2$ as an etchant. This iteration is designed mainly to remove exposure of the shallow trench insulator, 5, from subsequent processing steps.

This process, used to create anti-punchthrough regions, reducing depletion region leakages, and although shown for an NFET application, can also be applied to PFET devices, complimentary, (CMOS), devices, as well as BiCMOS devices. To accommodate a PFET application, an N well region, and a N type anti-punchthrough region, formed at a higher N type doping level then the N well region, would be created.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a MOSFET device, on a semiconductor substrate, comprising the steps of:

forming a shallow trench in said semiconductor substrate;

depositing a first insulator layer on said semiconductor substrate, completely filling said shallow trench;

removal of said first insulator layer from all areas of said semiconductor substrate, except from said shallow trench;

depositing a second insulator layer on said semiconductor substrate, including on said first insulator layer, in said shallow trench;

opening a region in said second insulator layer, to an area of said semiconductor substrate, to be used for gate region;

ion implanting a first dopant of a first conductivity type into said opened region, in said second insulator layer;

growing a gate oxide on region of said semiconductor substrate, exposed in said opened region of said second insulator layer;

depositing a first polysilicon layer on surface of said second insulator layer, on sides of said opened region, in said second insulator layer, creating a polysilicon sidewall, and on surface of said gate oxide, exposed in said opened region of said second insulator layer;

ion implanting a second dopant of the first conductivity type, through said first polysilicon silicon layer, through said gate oxide, and into said semiconductor substrate, in said opened region of said second insulator layer, not covered by said polysilicon sidewall;

depositing a second polysilicon layer on said first polysilicon layer;

ion implanting a third dopant of the second conductivity type into said second polysilicon layer;

removal of said second polysilicon layer, and of first polysilicon layer, from top surface of said second insulator layer, to form polysilicon gate structure, of said second polysilicon layer, and said first polysilicon layer, in said opened region of said second insulator layer;

removal of said second insulator layer;

ion implanting a fourth dopant of the second conductivity type into said semiconductor substrate, not covered by said polysilicon gate structure;

depositing a third insulator layer on said semiconductor substrate, and on said polysilicon gate structure;

anisotropic etching of said third insulator layer, to form insulator spacer on sides of said polysilicon gate structure;

ion implanting a fifth dopant of the second conductivity type into said semiconductor substrate, not covered by said polysilicon gate structure, or by said insulator spacer;

depositing a fourth insulator layer on said semiconductor substrate, including depositing on said polysilicon gate structure;

opening a contact hole in said fourth insulator layer, to a region on said semiconductor substrate;

depositing a metal layer on top surface of said fourth insulator layer, and on surface of said region, on said semiconductor substrate, exposed in said contact hole; and patterning of said metal layer to form a metal contact structure to said region, on said semiconductor substrate.

2. The method of claim 1, wherein said shallow trench is formed to a depth in said semiconductor substrate, between about 0.30 to 1.0 uM, and having a width between about 0.10 to 200 uM.

3. The method of claim 1, wherein said first insulator layer, used to fill said shallow trench, is silicon oxide, deposited using LPCVD or PECVD processing, at a temperature between about 400° to 800° C., to a thickness between about 5000 to 20000 Angstroms, using tetraethylorthosilicate as a source.

4. The method of claim 1, wherein said second insulator layer is silicon oxide, deposited using LPCVD or PECVD processing, at a temperature between about 400° to 800° C., to a thickness between about 3000 to 5000 Angstroms, using tetraethylorthosilicate as a source.

5. The method of claim 1, wherein said opened region, in said second insulator layer, is between about 0.10 to 0.40 uM, in width.

6. The method of claim 1, wherein said first dopant, is $BF_2$, ion implanted at an energy between about 10 to 30 Kev., at a dose between about 1E12 to 5E12 atoms/cm$^2$.

7. The method of claim 1, wherein said gate oxide is grown in an oxygen-steam ambient, at a temperature between about 700° to 1000° C., to a thickness between about 30 to 300 Angstroms.

8. The method of claim 1, wherein said first polysilicon layer is deposited using LPCVD processing, at a temperature between about 500° to 650° C., to a thickness between about 300 to 1000 Angstroms.

9. The method of claim 1, wherein said second dopant is boron, ion implanted at an energy between about 60 to 150 Kev., at a dose between about 1E12 to 3E13 atoms/cm$^2$.

10. The method of claim 1, wherein said second polysilicon layer is deposited using LPCVD processing, at a temperature between about 500° to 650° C., to a thickness between about 3000 to 5000 Angstroms.

11. The method of claim 1, wherein removal of said second polysilicon layer, and of said first polysilicon layer, from top surface of said second insulator layer, is accomplished via chemical mechanical polishing procedures, or a RIE procedure using $Cl_2$ as an etchant.

12. The method of claim 1, wherein said second insulator layer is removed via RIE processing, using $CHF_3$ as an etchant.

13. The method of claim 1, wherein said fourth dopant is phosphorous, or arsenic, ion implanted at an energy between about 10 to 50, at a dose between about 1E13 to 1E14 atoms/cm$^2$.

14. The method of claim 1, wherein said fifth dopant is arsenic, ion implanted at an energy between about 20 to 100 Kev., at a dose between about 1E15 to 5E15 atoms/cm$^2$.

15. A method for fabricating a MOSFET device, on a semiconductor substrate, incorporating an ion implanted region in the channel area, to reduce source and drain, to substrate leakage, comprising the steps of:

forming a shallow trench in said semiconductor substrate;

depositing a first insulator layer on said semiconductor substrate, completely filling said shallow trench;

removal of said first insulator layer from all areas of said semiconductor substrate, except from said shallow trench;

depositing a second insulator layer, on said semiconductor substrate, including on said first insulator layer, in said shallow trench;

opening a region in said second insulator layer, to an area of said semiconductor substrate, to be used for gate region;

ion implanting a first dopant of the first conductivity type, into said opened region in said second insulator layer, for purposes of threshold voltage adjustments;

growing a gate oxide on area of said semiconductor substrate, exposed in said opened region in said second insulator layer;

depositing a first polysilicon layer on surface of said second insulator layer, on sides of said opened region in said second insulator layer, creating a polysilicon sidewall, and on surface of said gate oxide, exposed in said opened region of said second insulator layer;

ion implanting a second dopant of the first conductivity type, through said first polysilicon layer, through said gate oxide, and into said semiconductor substrate, in said opened region in said second insulator layer, not covered by said polysilicon sidewall, to create a region that reduces junction punchthrough leakage;

depositing a second polysilicon layer on said first polysilicon layer;

ion implanting a third dopant of the second conductivity type into said second polysilicon layer;

removal of said second polysilicon layer, and of said first polysilicon layer, from top surface of said second insulator layer, to form polysilicon gate structure, composed of said second polysilicon layer, and said first polysilicon layer, in said opened region of said second insulator layer;

removal of said second insulator layer;

ion implanting a fourth dopant of the second conductivity type into said semiconductor substrate, not covered by said polysilicon gate structure, to form lightly doped source and drain regions;

depositing a third insulator layer on said semiconductor substrate, and on said polysilicon gate structure;

anisotropic etching of said third insulator layer, to form insulator spacer on sides of said polysilicon gate structure;

ion implanting a fifth dopant of the second conductivity type into said semiconductor substrate, not covered by said polysilicon gate structure, and not covered by said insulator spacer, to form heavily doped source and drain regions;

depositing a fourth insulator layer on said semiconductor substrate, including deposition on said polysilicon gate structure;

opening a contact hole in said fourth insulator layer, to said heavily doped source and drain regions;

depositing a metal layer on top surface of said fourth insulator layer, and on surface of said heavily doped source and drain regions, exposed in said contact hole; and patterning of said metal layer to form a metal contact structure to said heavily doped source and drain regions.

16. The method of claim 15, wherein said shallow trench is formed to a depth in said semiconductor substrate, between about 0.30 to 1.0 uM, having a width between about 0.10 to 200 uM.

17. The method of claim 15, wherein said first insulator layer, used to fill said shallow trench, is silicon oxide, deposited using LPCVD or PECVD processing, at a temperature between about 400° to 800° C., to a thickness between about 5000 to 20000 Angstroms, using tetraethylorthosilicate as a source.

18. The method of claim 15, wherein said second insulator layer is silicon oxide, deposited using LPCVD or PECVD processing, at a temperature between about 400° to 800° C., to a thickness between about 3000 to 5000 Angstroms, using tetraethylorthosilicate as a source.

19. The method of claim 15, wherein said opened region, in said second insulator layer, to be used for said gate region, is between about 0.10 to 0.40, in width.

20. The method of claim 15, wherein said first dopant, used to for threshold voltage adjustment, is $BF_2$ or boron, ion implanted at an energy between about 10 to 30 Kev., at a dose between about 1E12 to 5E12 atoms/cm$^2$.

21. The method of claim 15, wherein said gate oxide is grown in an oxygen-steam ambient, at a temperature between about 700° to 1000° C., to a thickness between about 30 to 300 Angstroms.

22. The method of claim 15, wherein said first polysilicon layer is deposited using LPCVD processing, at a temperature between about 500° to 650° C., to a thickness between about 300 to 1000 Angstroms.

23. The method of claim 15, wherein said second dopant, used to create a region that reduces junction punchthrough leakage, is boron, ion implanted at an energy between about 60 to 150 Kev., at a dose between about 1E12 to 3E13 atoms/cm$^2$.

24. The method of claim 15, wherein second polysilicon layer is deposited using LPCVD processing, at a temperature between about 500° to 650° C., to a thickness between about 3000 to 5000 Angstroms.

25. The method of claim 15, wherein removal of said second polysilicon layer, and of said first polysilicon layer, from the top surface of said second insulator layer, is accomplished via chemical mechanical polishing procedures, or RIE procedures using $Cl_2$ as an etchant.

26. The method of claim 15, wherein removal of said second insulator layer is accomplished via RIE procedures, using $CHF_3$ as an etchant.

27. The method of claim 15, wherein said fourth dopant, used to create said lightly doped source and drain regions, is phosphorous, or arsenic, ion implanted at an energy between about 10 to 50 Kev., at a dose between about 1E13 to 1E14 atoms/cm$^2$.

28. The method of claim 15, wherein said fifth dopant is arsenic, ion implanted at an energy between about 20 to 100 Kev., at a dose between about 1E15 to 5E15 atoms/cm$^2$.

* * * * *